United States Patent

Briley

[15] 3,694,666

[45] Sept. 26, 1972

[54] TRANSISTOR LOGIC CIRCUITS

[72] Inventor: Bruce Edwin Briley, Countryside, Ill.

[73] Assignee: Bell Telephone Laboratories, Incorporated, Berkeley Heights, N.J.

[22] Filed: May 14, 1971

[21] Appl. No.: 143,314

[52] U.S. Cl. ....................307/218, 307/299 A

[51] Int. Cl. ....................H03k 19/22, H03k 19/30

[58] Field of Search ....................307/299 A, 218

[56] References Cited

UNITED STATES PATENTS 3,233,125 2/1966 Buie ....................307/299 A 3,416,003 12/1968 Walker ....................307/218 X

*Primary Examiner*—John Zazworsky

*Attorney*—R. J. Guenther and R. B. Ardis

[57] ABSTRACT

A general purpose transistor logic circuit comprising an AND and an OR stage serially connected in either sequence. Each stage comprises multiemitter input transistor and a single emitter output transistor, the transistors of each stage being of the opposite conductivity type. Each stage provides an emitter follower output to achieve a substantial increase in switching speed and the combined stages effectively cancel voltage shifts occurring across each.

3 Claims, 2 Drawing Figures

INVENTOR
B. E. BRILEY
BY William H. Kamstra
ATTORNEY

TRANSISTOR LOGIC CIRCUITS

BACKGROUND OF THE INVENTION

This invention relates to transistor logic circuits and more particularly to such circuits adapted for use as generally applicable logic building blocks.

Standard logic circuits having universal logic applicability are well known in the art and have taken a variety of forms. Whatever the advantages achieved by the various available circuits, all have been designed with a view to the continuing demand in data processing systems for greater operative speeds. The data handling capacity of any system is directly related to the speed with which its logic circuitry can handle digital pulses. One prior art circuit performing a NAND logic function, for example, the transistor-transistor-logic gate (TTL), has found wide employment in the field. This circuit, like others, being logically complete, may be used to generate any logic function and has the advantage of providing active "pull-up" and "pull-down" in the transistor output stage. This circuit takes its logical output signal from the collector of the latter stage thereby providing the inversion step of the NAND function. This inversion, on the other hand, prevents the circuit from obtaining its highest switching speed. Because of the base-collector characteristics of the transistor, voltage changes on the collector tend to follow those on the emitter when the transistor is switched to its conducting state. Further, when these and other known logic circuits are employed in a serial arrangement, substantial voltage drops must be compensated for if the available signal is not to be attenuated in very few stages.

It is an object of this invention to provide a new and novel transistor logic circuit adapted for use as a general purpose logic building block.

Another object of this invention is a transistor logic circuit capable of higher operating speeds with minimum power dissipation than was hitherto possible.

A further object of this invention is a logic circuit unit providing its own compensation for voltage shifts caused by transistor base-emitter voltage drops.

BRIEF DESCRIPTION OF THE INVENTION

The foregoing and other objects of this invention are realized in one illustrative embodiment thereof comprising a pair of complementary transistor logic stages, one performing an AND function and the other an OR function. Each stage comprises a multiemitter input transistor and a single emitter output transistor, the transistor pairs of the two stages being of the opposite conductivity type. Thus, in a typical arrangement where the AND stage precedes in the pair sequence, the transistors of that stage are of the NPN conductivity type, the OR transistors then being of the PNP conductivity type. Whichever the sequence, each of the plural emitters of an input transistor is provided with an input terminal and the emitter of the output transistor of each stage provides the output point for the succeeding stage. By thus taking the output from the emitter a substantial gain in operating speed is advantageously achieved at the relatively negligible cost of eliminating an inversion of output signals at each stage. The latter presents no serious loss since the need for complementation in generalized logic is small and in fact does away with frequently time-consuming unnecessary complementation. Further, complementation can be effected with these circuits via interchanging rails when a double-rail structure is used.

The logic circuit of this invention is intended for use to achieve alternating sequences of logic functions. As a result, the voltage shift compensation feature of this invention advantageously makes possible combinations of such sequences presenting only negligible voltage drops. Thus, a voltage drop introduced by an OR stage, according to this invention, is almost precisely compensated for by a voltage gain in the AND stage.

According to another feature of this invention, the two logic gates are conveniently adapted for fabrication on a single chip of semiconductor material. Recent advances in the integrating of circuits have made possible monolithic circuits incorporating both NPN and PNP type transistors. As will appear hereinafter, the logic circuits of this invention also comprise a minimum of dissipative elements thereby permitting a compact integrated implementation with an attendant yield increase and cost reduction during fabrication.

DESCRIPTION OF THE DRAWING

The foregoing and other objects and features of this invention together with its organization will be better understood from a consideration of a detailed description thereof when taken in conjunction with the accompanying drawing in which.

In this connection, it will be apparent that when a number of logic stages are required to accomplish a logic function, whether or not including fan-out or fan-in, these may be achieved by employing logic arrangements according to this invention with either sequence of logic gates. Although the operation of the stages of either sequence is identical, they are specifically included to ensure completeness of description.

DETAILED DESCRIPTION

Figure 1:
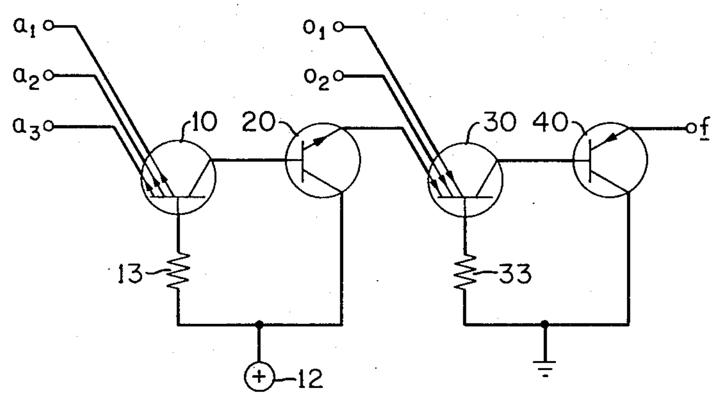
FIGS. 1 and 2 depict alternate specific embodiments of general purpose logic circuits according to the principles of this invention, the first comprising an AND-OR sequence of logic gates and the second comprising an OR-AND sequence.

In FIG. 1 an illustrative embodiment of this invention is depicted in which an output of an AND logic stage is applied to one of the multiple inputs of an OR logic stage. The AND stage comprises a pair of NPN type transistors 10 and 20, the base of the latter being connected to the collector of the former. The transistor 10 is provided with a plurality of emitters connected respectively to a plurality of input terminals $a_1$, $a_2$, and $a_3$. The base of transistor 10 is connected to a source of positive potential 12 through a resistor 13, the source 12 also being connected to the collector of transistor 20. The latter connection is made directly without intervening circuit elements to avoid any sacrifice in speed of operation as will be considered hereinafter.

The OR stage comprises a pair of PNP transistors 30 and 40, the base of the latter transistor being connected directly to the collector of transistor 30. The latter transistor is provided with a plurality of emitters connected respectively to input terminals $0_1$ and $0_2$. One of the emitters of transistor 30 is connected directly to the emitter of output transistor 20 of the AND stage. The base of the latter transistor is connected to ground through a resistor 33; the collector of transistor 40 is also connected directly to ground without intervening circuit elements. Finally, an output terminal *f* is provided for the emitter output point of output transistor 40. Transistors 10 and 40 of the embodiment of FIG. 1 are operated as emitter followers and since they alternate in conductivity type, compensate for each other's base-emitter voltage shift which, for silicon transistors, was determined as 0.6 volts decrease for the AND stage and the same voltage shift increase for the OR state.

In describing a typical operation of the logic circuit of FIG. 1 it will be assumed that connected to the terminals *a* of the input transistor 10 are sources of input voltage pulses controlled by the system with which this invention may be adapted for use. The voltage sources may thus comprise, for example, preceding stages of a logic network made up of the logic building blocks of this invention, the network providing fan-in at the AND stage of FIG. 1. In accordance with conventional practice, the AND stage will produce an output at the emitter of transistor 20 only when all of the input terminals *a* are energized simultaneously by appropriate input voltage pulses. Assuming at least one of the emitters (and its terminal) is connected to a reference potential more negative than the collector of transistor 10, then all of the base-collector current of transistor 10 is diverted from the base and the transistor 20 will remain non-conducting. When the AND condition is met, each of the terminals *a* will have applied thereto a positive-going input signal (conventionally indicative of a binary "1") and the base current of transistor 10 is diverted to its collector thereby turning on transistor 20. As the latter transistor conducts, its emitter rises rapidly to the value of the potential source 12, the positive-going potential being also conventionally representative of a binary "1". The base-emitter current thus initiated is applied to the connected emitter of succeeding transistor 30, the base resistor 33 of this transistor providing the load for this current. The direct connection of the collector of transistor 20 to the source of potential 12 ensures that this transistor is never driven to saturation thereby avoiding any sacrifice in switching speed on this account.

Turning to the OR stage of the circuit of FIG. 1, it will be assumed that the output terminal *f* is connected to a succeeding AND gate of an alternating sequence of logic circuits contemplated in connection with the employment of this invention. Thus, the terminal *f* may be assumed to be directly connected to an input terminal *a* of a succeeding logic stage such as an AND circuit of the character already described. The terminals $0_1$ and $0_2$ of the multiemitter input transistor 30 may be connected to preceding similar AND gates or to other logic circuits as required by the particular logic function to be generated. Assuming the foregoing terminal connections and no inputs on the emitters of transistor 30, transistor 40 will be normally conducting with the result that the terminal *f* will be near ground potential and with the further result that a succeeding transistor 10 will also be conducting. All of the base current of the transistor 30 will thus be diverted from the emitters as long as none is above ground potential. When any one of the inputs $0_1$, $0_2$, or the connection to the emitter of transistor 20, has applied thereto a positive-going voltage pulse, as is the case with the latter connection, the base current of transistor 30 is diverted from its collector to the emitter so connected and, as a result, the output transistor is turned off. The output terminal *f* then rises to the level of the positive potential to which it was assumed connected via a succeeding transistor 10. The positive-going potential on the terminal *f* is conventionally representative of a binary "1" indicative that the nonexclusive OR condition of the stage has been met by the inputs on the emitters of transistor 30.

In the AND stage, the voltage shift across the transistor 10 is substantially zero; across the base and emitter of transistor 20 the shift, in the case of silicon transistors, has been found to be negative in the amount of about 0.6 volts. Similar voltage conditions obtain in the OR stage with the difference that the shift across the base and emitter of transistor 40 is positive in the same amount. Employing the circuit of this invention in a serial network in a manner so that the AND and OR stages continually alternate, it is clear that any voltage drop caused by the diode shifts of the transistors of the stages is canceled, thereby preventing undue attentuation of the logic signals transmitted.

Figure 2:
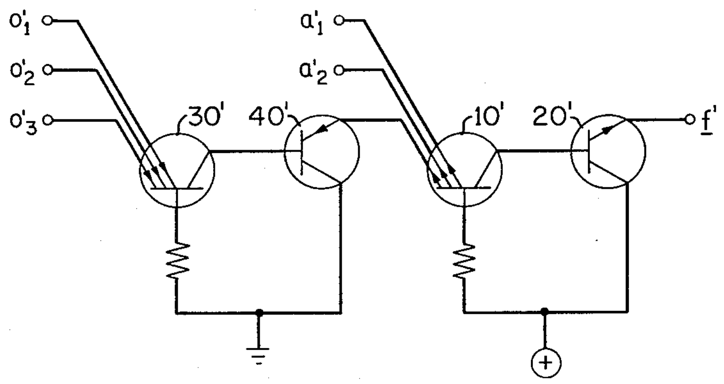

In FIG. 2 is also shown a logic circuit according to the principles of this invention in which the order of the AND and OR stages is reversed from that of the embodiment of FIG. 1. Thus, or OR stage comprising a pair of transistors 30' and 40' has an output emitter of the latter transistor connected to one of the plural emitters of the input transistor 10' of the AND stage. In operation, the stages of the logic circuit of FIG. 2 are identical to that described for the corresponding stages of the circuit of FIG. 1. Manifestly either the circuit of FIG. 1 or that of FIG. 2 may be employed to realize the same logical network with the only difference residing in the points in the network where the inputs are applied and where the outputs are taken. In either circuit embodiment, each stage compensates for the other's voltage shift and in each case the base resistor of the input transistor of the following stage provides the resistive load for the emitter follower of the preceding stage.

What have been described are considered to be only illustrative embodiments of this invention and it is to be understood that various and numerous other arrangements may be devised by one skilled in the art without departing from its spirit and scope as defined by the accompanying claims.

1. A general purpose logic circuit combination comprising a first logic gate comprising a first transistor of one conductivity type having a plurality of emitters, a collector, and a base, a first reference potential source connected to said base, and a second transistor of said one conductivity type having an emitter, a collector connected to said first reference potential source, and a base connected to said collector of said first transistor; a second logic gate comprising a third transistor of the other conductivity type having a plurality of emitters one of which being connected to said emitter of said second transistor, a collector, and a base, a second reference potential source connected to said base of said last-mentioned transistor, and a fourth transistor of said other conductivity type having an emitter, a collector connected to said second reference potential source, and a base connected to said collector of said third transistor; an output terminal connected to said emitter of said fourth transistor; and a load resistor for said second transistor connected between the base of said third transistor and said second reference potential source.

2. A general purpose logic circuit combination as claimed in claim 1 in which said first and second transistors are of the NPN conductivity type.

3. A general purpose logic circuit combination as claimed in claim 1 in which said first and second transistors are of the PNP conductivity type.

* * * * *